(12) United States Patent
Foster (10) Patent No.: US 8,901,681 B1
(45) Date of Patent: Dec. 2, 2014

(54) METHOD AND APPARATUS FOR ATTACHMENT OF MEMS DEVICES

(71) Applicant: Michael John Foster, Groton, MA (US)

(72) Inventor: Michael John Foster, Groton, MA (US)

(73) Assignee: Qualtre, Inc., Marlborough, MA (US)

( * ) Notice: Subject to any disclaimer, the term of this patent is extended or adjusted under 35 U.S.C. 154(b) by 0 days.

(21) Appl. No.: 13/796,262

(22) Filed: Mar. 12, 2013

(51) Int. Cl.
*H01L 29/84* (2006.01)
*B81B 3/00* (2006.01)
*B81C 1/00* (2006.01)

(52) U.S. Cl.
CPC .......... *B81B 3/0018* (2013.01); *B81C 1/00261* (2013.01)
USPC ......... 257/415; 257/E29.324; 73/493; 73/514

(58) Field of Classification Search
USPC ............ 257/727, 415, E29.324; 73/493, 514
See application file for complete search history.

(56) References Cited

U.S. PATENT DOCUMENTS 7,073,380 B2 * 7/2006 Foote et al. .................. 73/493

* cited by examiner

*Primary Examiner* — Marc Armand
(74) *Attorney, Agent, or Firm* — Burns & Levinson LLP; Bruce D. Jobse, Esq.

(57) ABSTRACT

A pedestal projection having reduced cross-sectional area secures a MEMs device to a housing surface in a manner which reduces strain on the MEMS die due to differences in coefficients of thermal expansion while more evenly distributing to the MEMS sensor any external forces mechanically coupled through the housing structure. The pedestal projection may be integrally formed with a surface on either MEMS die or housing member and is axially aligned with the structure which anchors the MEMS sensor to the MEMS die.

20 Claims, 5 Drawing Sheets

METHOD AND APPARATUS FOR ATTACHMENT OF MEMS DEVICES

FIELD OF THE INVENTION

The disclosure relates to Microelectromechanical Systems (MEMS) devices, and, more specifically, to an apparatus and technique for securing a MEMS device within its packaging.

BACKGROUND OF THE INVENTION

Microelectromechanical Systems (MEMS) devices are typically attached to a housing structure, and the housing structure attached to another entity, such as a circuit board. Small strain forces between the housing structure and the MEMS device may detrimentally affect the performance of the MEMS sensor located within the MEMS device.

Figure 1A:
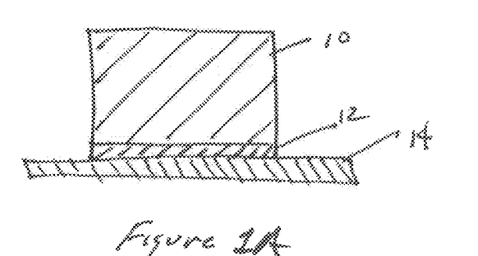
FIGS. 1A-B illustrate conceptually a cross-sectional view of the effects of bonding temperature and TCE mismatch between a MEMS device die and bonding agent relative to a substrate surface.
Figure 1B:
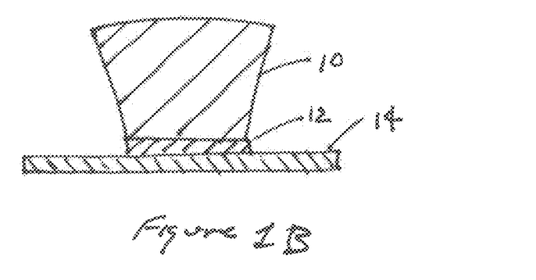

It is common practice to attach a MEMs die to a housing substrate using the full surface of the handle layer (the underside of the MEMs die). MEMs devices are sensitive to packaging strains which may be caused by a mismatch in Thermal Coefficient Of Expansion (TCE) and by the elevated bonding temperatures involved during the attachment process. For example, FIG. 1A illustrates conceptually the shape of a MEMS die 10 at bonding temperature relative to a layer of bonding agent 12, such as epoxy, used to attach the handle layer of the MEMS die 10 to a substrate surface 14. FIG. 1B illustrates the deep formation of the MEMS die shape after bonding, at room temperature, as a result of epoxy shrinkage and TOE mismatch between the material of the MEMS die 10 and the bonding agent 12. Such deformations create strain forces may have an influence on the accuracy and performance of the sensor, particularly sensors such as gyroscopes and accelerometers, and even more specifically for sensors implemented with bulk acoustic wave resonators in which the distances and alignment between the resident body and the drive and sense electrodes are microscopic.

Accordingly, need exists for a way to reduce strains on a MEMS die caused by the manner and process by which MEMS die is mounted.

An additional concern created by the practice of attaching a MEMs die to a housing substrate using the full surface of the handle layer, is the increased sensitivity to external forces transmitted through the package housing. Such configuration allows for any shock, vibration or other external force on the package to be mechanically coupled to the MEMs die and, ultimately, to any sensor mounted on the MEMs die. Again, such forces may influence the accuracy and performance of the sensor, particularly sensors such as gyroscopes and accelerometers. Prior attempts have been made to address the issue of isolating a MEMS die for mechanical vibrations. For example, U.S. Pat. No. 7,280,262 discloses a technique for attaching a MEMS device to its packaging at only the edges of MEMS die, however, although such device reduces the area of the handle layer surface secured to a housing surface, external forces and vibrations may still be transmitted to the sensor on the MEMS device from the edges of the MEMS die which is particularly problematic with a bulk acoustic wave sensor having a disc shaped resonant body.

Accordingly, a need exists for a mechanism to attach a MEMS die to its respective packaging in a manner which reduces external influences, such as mechanical vibrations incident on the MEMS device packaging.

SUMMARY OF THE INVENTION

Disclosed is a mechanism for attachment of a MEMS die to a housing substrate surface in a manner which deformations caused by TCE mismatch and redirects mechanically coupled external forces in a manner which is less detrimental to the performance of the sensor. Specifically, the handle layer of a MEMs die may be partially cut or etched to define a pedestal projection or pillar of significantly reduced size relative to the handle layer and which serves as the point of attachment between the MEMS die and a substrate surface of the MEMS device housing. By attaching the MEMS die to a substrate at the smaller end area of the pillar, differences in the material properties between the handle layer that and bonding material may have a smaller effect on the critical structure of the MEMs device. Also, by attaching the MEMS die to the housing substrate by only the small end area of the pedestal projection, external strains are less likely to be mechanically coupled from the device housing to the MEW die.

In addition, the location of the pillar, and to the point of attachment, is chosen to isolate the sensor from mechanical vibrations on the housing and to more evenly distribute transmitted external forces to the sensor in a manner which is less likely to negatively affect its performance. Specifically, a sensor, such as an accelerometer or gyroscope, is mounted to the MEMs die via an anchor. The center of the sensor is often attached at one end of the anchor, particularly if the sensor is a disc-shaped resonator element. Note, the anchor upon which the sensor is mounted may or may not be disposed at the center of the MEMs die. In accordance with the disclosure, the location of the reduced area pillar on the handle layer of the MEMs die is axially aligned with the center of the anchor upon which the sensor is mounted, and, therefore, symmetrically centered under the sensor enabling any forces which are transmitted through the pillar and the anchor to be symmetrically distributed throughout the sensor in a manner which will mitigate any influence thereupon.

According to one aspect of the disclosure, a MEMS device comprises: a MEMS die member having a handle layer with a first surface area; and a pedestal projection extending outward from the handle layer and defining an attachment end having a second surface area; wherein a mutually exclusive ratio of the first surface area to the second surface area is greater than 3 to 1. In one embodiment, the MEMS device further comprises a plurality of channels defined within the handle layer and at least partially separating pedestal projection from other portions of the handle layer.

According to another aspect of the disclosure, a MEMS device comprises: a MEMS die member having a handle layer surface; a housing member having a base surface; a pedestal projection disposed intermediate the handle layer surface and the base surface and having an attachment end; and a bonding agent disposed at the attachment end of the pedestal projection; wherein the MEMS die member is attached to housing member only at the attachment end of the pedestal projection and wherein a mutually exclusive ratio of surface area of the handle layer surface to surface area of the attachment end is greater than 3 to 1. In one embodiment, the pedestal projection is integrally formed with the MEMS die member and extends outward from the handle layer surface thereof. In another embodiment, the pedestal projection is integrally formed with the housing member and extends outward from the base surface thereof.

According to still another aspect of the disclosure, a MEMS device comprises: a MEMS die member defining an anchor extending along an axis; a sensor disposed symmetrically relative to an end of the anchor; and a projection extending along the axis and disposed intermediate the sensor and a housing surface; wherein forces transmitted between housing surface and the sensor are transmitted through the projection and anchor along the axis.

According to yet another aspect of the disclosure, a method of manufacturing a MEMS device comprises: providing a MEMS die member having a handle layer surface; and removing a portion of the MEMS die member proximate the handle layer surface to define a pedestal projection integrally formed therewith and extending outward from the handle layer surface, the pedestal projection having an attachment surface disposed at an end thereof, wherein a mutually exclusive ratio of surface area of the handle layer surface to surface area of the attachment surface is greater than 3 to 1. In one embodiment, the method further comprises removing a portion of the MEMS die member proximate the handle layer surface to define a plurality of secondary projections integrally formed with, and extending outward from, the handle layer surface, wherein the plurality of secondary projections are at least partially separated the pedestal projection along the handle layer surface. In another embodiment, the method further comprises securing the MEMS die member to the housing surface only at the attachment surface of the pedestal projection with a bonding agent.

DESCRIPTION THE DRAWINGS

Embodiments of the disclosed subject matter are described in detail below with reference to the following drawings in which.

DETAILED DESCRIPTION

Referring to FIGS. 2-6, disclosed is a Microelectromechanical Systems (MEMS) package 20 comprising a housing member 22 having a cavity with a base surface 24 and a MEMS device 25, including a MEMS die member 26, bonded to the base surface 24 by a reduced size pedestal projection 28 extending from the handle layer surface 27 of MEMS die member 26. Housing 22, illustrated in partial cross-section in FIGS. 2 and 6, may additionally comprise a lid portion, not illustrated. The MEMS device 25 further comprises a MEMS sensor 30 which is supported by an anchor 32 to a surface of MEMS die member 26. For MEMS sensors 30 which comprise accelerometers, gyroscopes or other devices, especially bulk acoustic wave resonator based devices, anchor 32 extends along an axis 40 which is disposed symmetrically relative to sensor 30. For example, if the sensor 30 comprises a bulk acoustic wave resonator having a disc shaped resonator element, such as disclosed in United States Patent Application Publication 2012/0227,487, the sensor 30 may be supported at the disc center by anchor 32. For other devices utilizing a capacitive resonator element, such as those disclosed in U.S. Pat. No. 7,023,065, anchor 30 may still support the sensor symmetrically so as not to bias the performance of the sensor due to its location. Note that within the exterior perimeter shape defined by MEMS die member 26, the sensor 30 may be located at the center MEMS die member 26 or at other locations, as illustrated in FIG. 5B.

Figure 2:
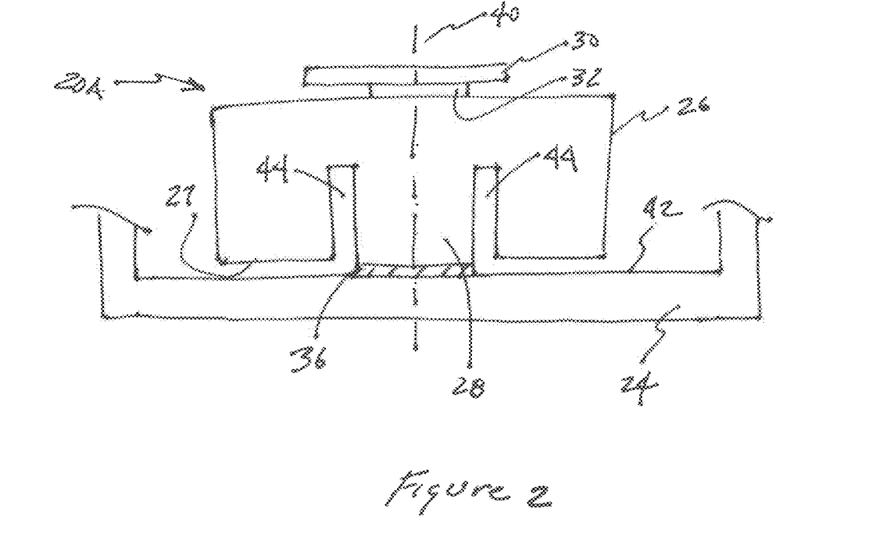
FIG. 2 is illustrates conceptually a cross-sectional view of a MEMS device die formed in accordance with an embodiment of the present disclosure.

As illustrated in FIG. 2, pedestal projection 28 extends between handle layer surface 27 and base surface 24 along axis 40 and is substantially axially aligned with anchor 32. In this manner, pedestal projection 28 in most instances will be symmetrically positioned relative to sensor 30, as mounted within MEMS die member 26. Pedestal projection 28 defines at an end thereof and attachment end surface 34 which is attached to base surface 24 of the housing 24 by bonding agent 36, such as epoxy, disposed there between. It will be obvious to those skilled in the art that other similarly suitable bonding agents, other than epoxy, may be disposed adjacent attachment end surface to secure MEMS device 25 within housing member 22. Pedestal projection 28 herein may have a circular, rectangular or irregular shaped cross-section that may vary over the axial length thereof from handle layer surface 27 of MEMS die member 26 to the attachment end surface 34 where it is joined by bonding agent 36 to base surface 24. In the embodiments disclosed herein, the bonded area between the MEMS device 25 and the housing member 22 is limited to the attachment end surface 34.

Figure 3:
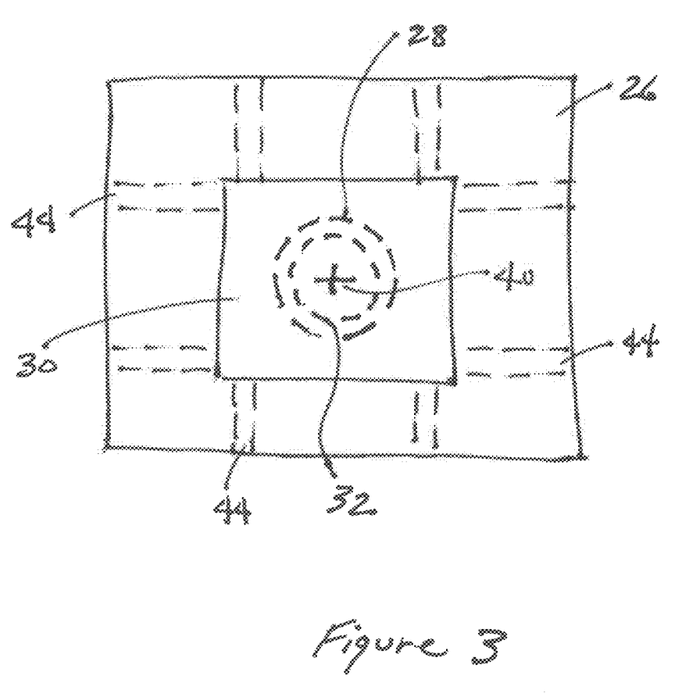
FIG. 3 illustrates conceptually a top view of a MEMS device die with a sensor and anchor/pedestal axis centered relative to the die member perimeter in accordance with an embodiment of the present disclosure.
Figure 5:
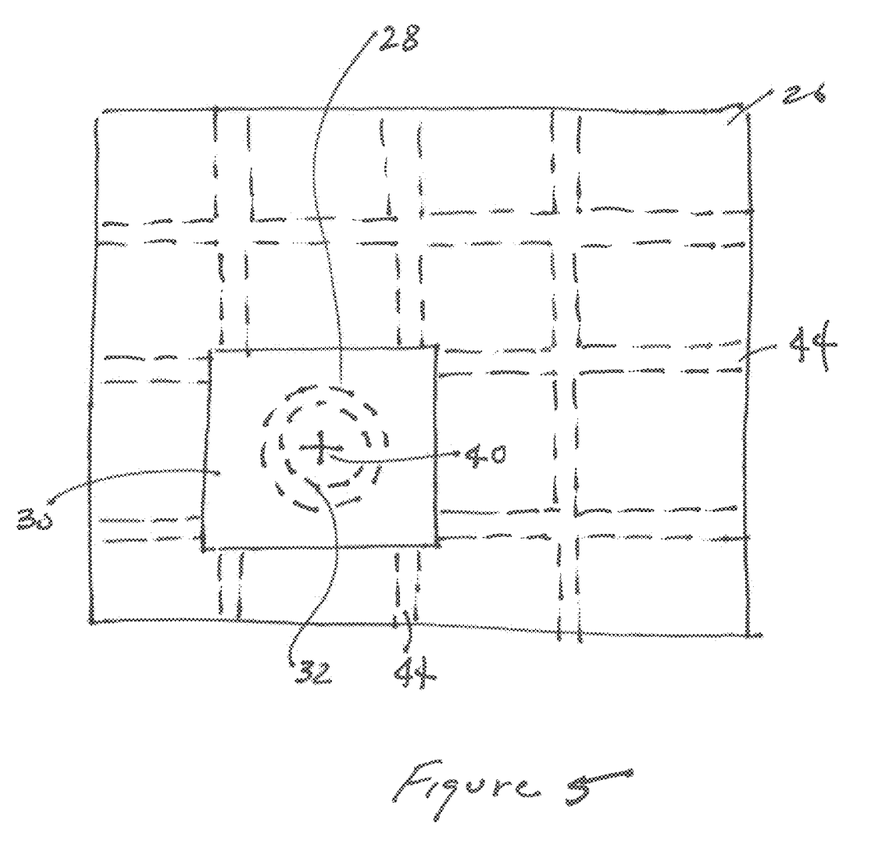
FIG. 5 illustrates conceptually a top view of a MEMS device die with a sensor and anchor/pedestal axis disposed not at the center of the die member perimeter in accordance with an embodiment of the present disclosure.

In order to create projection pedestal 28 of FIG. 2, the handle layer surface 27 of a MEMs the member 26 may be partially machined or etched through a mechanical process, including Partial Dicing, a chemical process, including KOH etching and EDP etching, as well as Deep Reactive Ion Etching or other means commonly known to one familiar with the art to define pedestal projection 28 projecting outwardly from the die member 26. The remaining handle layer material may be a continuous ring around the pillar, may be several separate pillars (as shown in the figures provided), or may be completely removed. The MEMs die may be attached to a substrate at the central pillar. FIG. 3 illustrates conceptually a top view of a MEMS device die with a sensor and anchor/pedestal axis 40 centered relative to the perimeter of MEMS die member 26. Alternatively, FIG. 5 illustrates a top view of a MEMS die member 26 with the sensor 30 and anchor/pedestal axis 40 disposed not at the center of MEMS die member 26. In both embodiments illustrated in FIGS. 3 and 5, because pedestal projection 28 is axially aligned with anchor 32 and, therefore, the center of sensor 30, any forces transmitted from housing member 22 through pedestal projection 28 MEMS die member 26 and finally to sensor 30, will be dispersed throughout sensor 30 symmetrically any matter which is less likely to cause inaccurate performance of the sensor then if such forces were mechanically coupled to the sensor from a particular direction.

Figure 4:
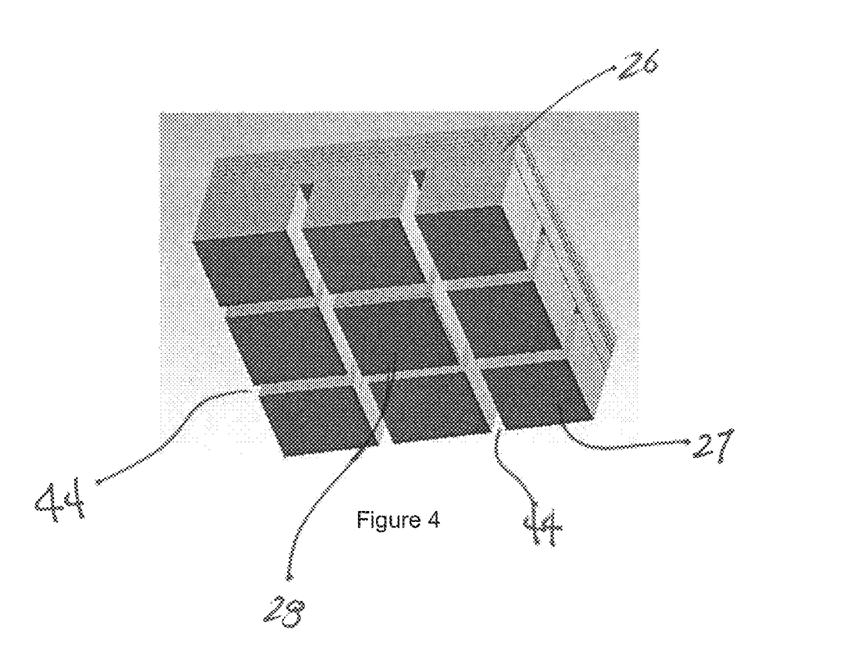
FIG. 4 illustrates conceptually an inverted perspective view of a MEMS device in accordance with another embodiment of the present disclosure.

FIG. 4 illustrates conceptually an inverted perspective view of a MEMS device 25 showing the relationship between channels 44, illustrated in phantom in FIGS. 3 and 5, and projection pedestal 28 on the handle layer surface 27. In some embodiments, the attachment and surface 34 of projection pedestal 28 is substantially in the same plane as the other projections formed by channels 44. Cavities or channels 44 also serve as isolation features to help absorb mechanical vibrations transmitted through pedestal projection 28 to the main body of MEMS die member 26 to further reduce their effect on sensor 30 and its respective performance.

Figure 6:
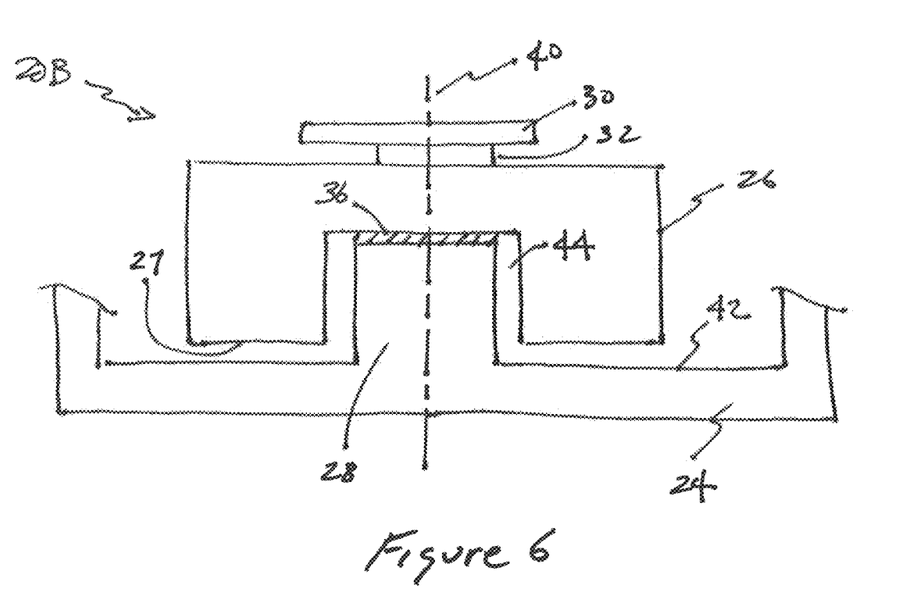
FIG. 6 is illustrates conceptually a cross-sectional view of a MEMS device die formed in accordance with another embodiment of the present disclosure.

FIG. 6 illustrates an alternative embodiment of the MEMS device 20 illustrated in FIG. 2. Specifically, in this embodiment, pedestal protection 28 instead of being in integrally formed with handle surface 27, is instead integrally formed with base surface 24 of housing 24 in accordance with an alternate embodiment of the present invention. As with the other embodiments, pedestal protection 28 may have a circular, rectangular or irregular shaped cross-section that may vary over the axial length thereof from the base surface 24 to the attachment surface 34 where it is joined by bonding agent 36 to handle layer surface 27 of MEMS die member 26. In the embodiment illustrated in FIG. 6, the base surface 24 of housing member 22 may be etched or machined to form pedestal protection 28, which is surrounded by the cavitous shape of housing member 22, may be formed by silicon or glass etching techniques, precision sawing, or other silicon or glass removal techniques depending upon the material composition of the base surface 24 of housing member 22. Note that the pedestal protection 28 may have a shaping construction similar to that described with reference to the embodiment of FIG. 2.

In another embodiment, pedestal projection 28, whether integrally formed with handle layer surface 27 or a piece structure 42 may have a circular cross-sectional shape having a diameter of approximately 28 μm over a substantial portion of its axial length. Note that the cross sectional shape of pedestal 28 at attachment and 34 may be the same as or to similar than that of the remaining axial length of pedestal 28. In one embodiment, the surface area of handle layer 47 is significantly larger than the cross-sectional surface area of attachment end 34, with the relative ratio of mutually exclusive surface areas therebetween (that is, the cross-sectional surface area of attachment end 34 not being included within the surface area of handle layer 47) being in the range from 3:1 to 24:1, but even more preferably in the range from 24:1 to 400:1, but even still more preferably in the range from 400:1 to 1600:1.

The reader will appreciate that a MEMS package 20 implemented as described herein will result in a MEMS device 25 which is less susceptible to strain forces due to differences in coefficients of thermal expansion between the MEMS device and bonding agent while more evenly distributing to the MEMS sensor any external forces mechanically coupled through the housing 22 to the sensor 30.

It will be obvious to those recently skilled in the art that modifications to the apparatus and process disclosed here in may occur, including substitution of various component values or nodes of connection, without parting from the true spirit and scope of the disclosure.

What is claimed is:

1. A microelectromechanical (MEMS) device comprising:
a MEMS die member having a handle layer with a first surface area;
a pedestal projection extending outward from the handle layer and defining an attachment end having a second surface area;
a sensor positioned symmetrically relative to an end of the anchor; and
wherein a mutually exclusive ratio of the first surface area to the second surface area is greater than 3 to 1.

2. The MEMS device of claim 1 further comprising:
a plurality of channels defined within the handle layer and at least partially separating the pedestal projection from other portions of the handle layer.

3. A microelectromechanical (MEMS) device comprising:
a MEMS die member having a handle layer surface;
a housing member having a base surface;
a pedestal projection disposed intermediate the handle layer surface and base surface and having an attachment end;
a bonding agent disposed at the attachment end of the pedestal projection;
a sensor positioned symmetrically relative to an end of the anchor; and
wherein the MEMS die member is attached to housing member only at the attachment end of the pedestal projection and wherein a ratio of surface area of the handle layer surface to surface area of the attachment end is greater than 2 to 1.

4. The MEMS device of claim 3 wherein the pedestal projection is integrally formed with the MEMS the member and extends outward from the handle layer surface.

5. The MEMS device of claim 3 wherein the pedestal projection is integrally formed with the housing member and extends outward from the base surface.

6. A microelectromechanical (MEMS) device comprising:
a MEMS die member defining an anchor extending along an axis;
a sensor positioned symmetrically relative to an end of the anchor;
a pedestal projection extending along the axis and disposed intermediate the sensor and a housing surface; and
wherein forces transmitted between the housing surface and the sensor are transmitted through the pedestal projection and anchor along the axis.

7. The MEMS device of claim 6 further comprising an adhesive securing the MEMS die member to the housing surface.

8. The MEMS device of claim 6 wherein the pedestal projection is integrally formed with the MEMS die member.

9. The MEMS device of claim 6 wherein the pedestal projection is integrally formed with the housing surface.

10. The MEMS device of claim 6 further comprising:
a plurality of secondary projections integrally formed with and extending outward from the MEMS the member.

11. The MEMS device of claim 6 further comprising:
a plurality of channels defined within the handle layer at least partially separating the pedestal projection from other portions of the handle layer.

12. The MEMS device of claim 6 further comprising:
a sensor symmetrically disposed relative to the axis.

13. The MEMS device of claim 12 wherein the sensor extends in a plane perpendicular to the axis.

14. The MEMS device of claim 6 in combination with a bonding agent disposed adjacent an end of the pedestal projection and the housing surface.

15. The MEMS device of claim 1 in combination with a bonding agent disposed adjacent the attachment end of the pedestal projection.

16. The MEMS device of claim 1 wherein the MEMS die member is attached to the housing surface only by the pedestal projection.

17. A method of manufacturing a microelectromechanical (MEMS) device comprising:
A) providing a MEMS the member having a handle layer surface; and
B) removing a portion of the MEMS the member proximate the handle layer surface to define a pedestal projection integrally formed therewith and extending outward from the handle layer surface, the pedestal projection having an attachment surface disposed at an end thereof, a sensor positioned symmetrically relative to the pedestal projection; and wherein a ratio of surface area of the handle layer surface to surface area of the attachment surface is greater than 3 to 1.

18. The method of claim 17 further comprising:

C) removing a portion of the MEMS the member proximate the handle layer surface to define a plurality of secondary projections integrally formed therewith and extending outward from the handle layer surface;

wherein the plurality of secondary projections are at least partially separated from the pedestal projection along the handle layer surface.

19. The method of claim 17 further comprising:

C) securing the MEMS the member to the housing surface only at the attachment surface of the pedestal projection.

20. The method of claim 19 wherein C) comprises:

C1) disposing a bonding agent intermediate the housing surface and the attachment surface of the pedestal projection.

\* \* \* \* \*

UNITED STATES PATENT AND TRADEMARK OFFICE
CERTIFICATE OF CORRECTION

| | | |
|---|---|---|
| PATENT NO. | : 8,901,681 B1 | Page 1 of 1 |
| APPLICATION NO. | : 13/796262 | |
| DATED | : December 2, 2014 | |
| INVENTOR(S) | : Michael John Foster | |

It is certified that error appears in the above-identified patent and that said Letters Patent is hereby corrected as shown below:

In the Claims

Column 6 line 15 (Claim 4), the portion of the line reading "projection is integrally formed with the MEMS the member" should read -- projection is integrally formed with the MEMS die member --

Column 6 line 39 (Claim 10), the portion of the line reading "and extending outward from the MEMS the member." should read -- and extending outward from the MEMS die member --

Column 6 line 59 (Claim 17), the portion of the line reading "A) providing a MEMS the member having a handle layer surface; and" should read -- A) providing a MEMS die member having a handle layer surface; and --

Column 6 line 61 (Claim 17), the portion of the line reading "B) removing a portion of the MEMS the member proximate-" should read -- B) removing a portion of the MEMS die member proximate --

Column 7 line 5 (Claim 18), the portion of the line reading "C) removing a portion of the MEMS the member proximate" should read -- C) removing a portion of the MEMS die member proximate --

Column 7 line 13 (Claim 19), the portion of the line reading "C) securing the MEMS the member to the housing surface" should read -- C) securing the MEMS die member to the housing surface --

Signed and Sealed this
Thirty-first Day of March, 2015

Michelle K. Lee
*Director of the United States Patent and Trademark Office*